[19] United States Patent
Barton

[11] Patent Number: 4,700,146
[45] Date of Patent: Oct. 13, 1987

[54] AUTOMATIC TUNING OF CAVITY KLYSTRON USING SAMPLED RF OUTPUT

[75] Inventor: James C. Barton, Indialantic, Fla.

[73] Assignee: Harris Corporation, Melbourne, Fla.

[21] Appl. No.: 836,821

[22] Filed: Mar. 6, 1986

[51] Int. Cl.⁴ ............................................. H03L 5/00
[52] U.S. Cl. ........................................ 331/7; 330/45;
   331/35; 331/83; 331/183; 455/125
[58] Field of Search ....................... 331/5, 6, 7, 83, 90,
   331/183, 35; 334/20, 21, 22; 455/125; 330/45;
   315/5.46, 5.47, 5.48, 5.53, 5.54

[56]  References Cited
   U.S. PATENT DOCUMENTS
   2,836,721  5/1958  Ratcliffe ................................. 331/7
   4,216,409  8/1980  Sato et al. ......................... 331/83 X FOREIGN PATENT DOCUMENTS
   670238  4/1952  United Kingdom .................... 331/7

Primary Examiner—Siegfried H. Grimm
Attorney, Agent, or Firm—Antonelli, Terry & Wands

[57] ABSTRACT

A processor-controlled drive motor system for tuning a cavity klystron monitors the output (amplitude-vs-frequency) of the klystron and compares that monitored performance output with an intended amplitude-vs-frequency profile. Differences between the two characteristics are employed by the processor to generate a set of tuning cavity control signals through which respective stepping motors for displacing each cavity tuning slug are driven. The processor iteratively adjusts the cavity tuner control signals in accordance with a prescribed kylstron tuning program until the monitored amplitude response is within a prescribed tolerance of a preestablished characteristic stored in memory.

12 Claims, 5 Drawing Figures

AUTOMATIC TUNING OF CAVITY KLYSTRON USING SAMPLED RF OUTPUT

FIELD OF THE INVENTION

The present invention relates to microwave (e.g. satellite) communication systems and is particularly directed to an arrangement for automatically tuning a cavity klystron to achieve a prescribed amplitude response.

BACKGROUND OF THE INVENTION

Klystrons are commonly employed as a basic signal source in microwave (e.g. satellite link) communication systems. As such, they are required to exhibit a prescribed output characteristic or amplitude response (e.g. flatness) over an operating bandwidth centered about a selected center frequency. Unfortunately, the tuning mechanism through which operation of the klystron is controlled is an extremely sensitive mechanism that does not offer the repeatability desired of signal control devices. Specifically, a klystron cavity tuner typically consists of a plurality of copper cavities and associated tuning slugs which are displaced back and forth in their respected cavities to establish the operational characteristics of the klystron. Usually, each slug is wrapped with a tungsten wire to assure a tight fit in its cavity. As tungsten is a considerably harder metal than copper, repeated movement of the tuning slug will wear down the wall of the cavity, thereby changing its dimensional tolerances and, consequently, its intended operational characteristics.

Because of the mutual interdependence of the tuning of the respective cavities, a klystron cannot be tuned by simply adjusting each tuning slug in an arbitrary order to a preestablished setting. Instead, control of the amplitude response of a klystron must be carried out by repeated back and forth adjustment of each tuning slug, through the use of a respective vernier (micrometer) adjustment knob for each slug, the rotational setting of which is graduated according to a prescribed tuning (number) chart. In a typical terminal environment, the klystron is housed in a protective equipment cabinet, access to the tuning elements of which is accomplished by way of a panel door. When tuning the klystron, the terminal operator rotates a roller chart to view the number settings to which the slug tuning knobs must be set, unlocks the knobs from their current positions, and then proceeds to tune the klystron, adjusting the knobs in a prescribed sequence and in accordance with the strict number settings of the tuning chart. If a setting is exceeded, even only slightly, the tuning adjustment must be backed off considerably and the procedure reinitiated which eliminates mechanical backlash. It may be appreciated, therefore, that errors in operator accuracy involving conventional mechanical adjustment mechanisms can add excessive tolerances to an already critical procedure. In fact, it has been found the amplitude response of a klystron tuned by two different operators under the same conditions will seldom be the same for both operators.

SUMMARY OF THE INVENTION

In accordance with the present invention, the effective non-repeatability of tuning cavity klystrons with conventional hand manipulated mechanical elements following a time consuming and considerably inexact "by-the-numbers" procedure is obviated by a processor-controlled drive motor system which monitors the output (amplitude-vs-frequency) of the klystron and compares that monitored performance output with an intended amplitude-vs-frequency profile. Differences between the two characteristics are employed by the processor to generate a set of tuning cavity control signals through which respective stepping motors for displacing each cavity tuning slug are driven. The processor iteratively adjusts the cavity tuner control signals in accordance with a prescribed klystron tuning program until the monitored amplitude response is within a prescribed tolerance of a preestablished characteristic stored in memory.

Because the tuning of the klystron is based upon monitoring its performance, rather than according to a "by-the-number" chart sequence, considerably improved accuracy of klystron operation over the operator-controlled approach is afforded. Moreover, because operator intervention is removed, human error is eliminated. In effect, the present invention assures repeatability of performance, over successive adjustments.

DETAILED DESCRIPTION

Figure 1:
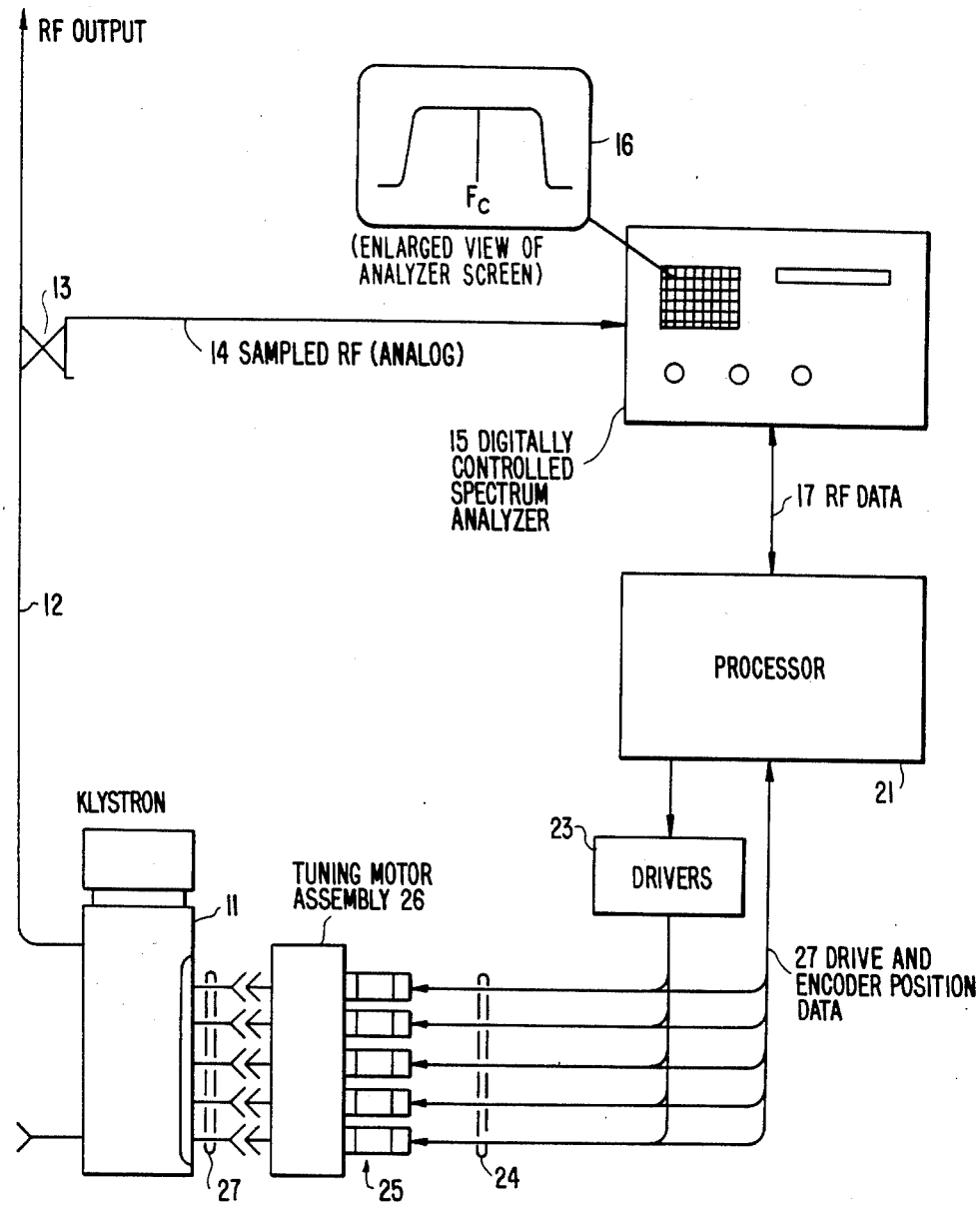
FIG. 1 is a schematic block diagram of the processor-controlled klystron tuning system according to the present invention.

Before describing, in detail, the particular improved klystron cavity tuning scheme in accordance with the present invention, it should be observed that the present invention resides primarily in a novel structural combination of conventional signal processing and motor drive circuits and not in the particular detailed configurations thereof. Accordingly, the structure, control and arrangement of such conventional circuits have been illustrated in the drawings by readily understandable block representations and schematic diagram, which show only those specific details that are pertinent to the present invention, so as not to obscure the disclosure with structural details which will be readily apparent to those skilled in the art having the benefit of the description herein. In addition, various portions of the signal processing circuitry (including data processor) have been appropriately consolidated and simplified in order to emphasize those portions that are most pertinent to the present invention. Thus, the block diagram illustrations of the drawings do not necessarily represent the mechanical structural arrangement of the exemplary system, but are primarily intended to illustrate the major structural components of the system in a conventional functional grouping, whereby the present invention may be more readily understood.

Referring now to FIG. 1, there is shown a schematic block diagram of a cavity klystron tuning system in accordance with the present invention. In the exemplary embodiment, a klystron power amplifier 11, such as a VKX-7780F-1, five cavity klystron, manufactured by Varian, has its output coupled to an RF output microwave link 12. By way of a coupler 13, the RF output of the klystron 11 is coupled over link 14 to a digitally controlled spectrum analyzer 15 whereby the output of the klystron 11 may be monitored. For this purpose, spectrum analyzer 15 may comprise a Hewlett Packard 8566 RF spectrum analyzer which has an output (IEEE-488) data bus 17 for supplying all of the information pertaining to the RF signal on input link 14 being monitored. A pictorial illustration of an exemplary amplitude versus frequency of the output of the klystron as monitored by spectrum analyzer 15 is represented in FIG. 1 by the enlarged portion of the display screen 16 adjacent analyzer 15. The amplitude response data from the spectrum analyzer is coupled over data bus 17 to a processor 21 which operates, in effect, as a smart motor controller for operating an assembly 26 of tuning motors for the five cavities of the klystron. Processor 21 includes customary I/O buffer circuitry, central processing unit and associated memory in which the control program for operating the drive motors in accordance with the amplitude response as monitored by the spectrum analyzer 15 is stored. Output signals for controlling assembly 26 of drive motors for the cavities of the klystron are coupled over link 22 to a set of motor drive amplifiers 23. The outputs of amplifiers 23 are coupled over link 24 to stepping motor assembly 26 which contains (five) respective stepping motors for controlling the displacement of a set of drive rods or shafts 27 for the cavity tuning slugs of the klystron. In order to monitor the displacement of each of the drive shafts in response to the action of the stepping motors, a set of shaft position encoders 25 is provided. The output of each encoder 25 is coupled over link 27 to supply the processor 21 with an indication of the position of each shaft, and thereby the location of each tuning stub within the klystron cavity.

In operation, a tuning program, to be discussed below, for controlling stepping motors of the tuning motor assembly 26 and thereby the displacement of the tuning slug shafts 27 of the klystron, is loaded into memory of processor 21.

In order to properly tune each of the cavities to achieve the desired response, the correction program stored in memory of processor 21 is prepared using the instructions provided by the klystron manufacturer for each of the cavities of the klystron. The manufacturer will supply a data sheet indicating how displacement of the cavity tuner will effect the overall response produced by the tube. As an example, for the above-referenced klystron type VKX-7780F-1, manufactured by Varian, the following cavity response conditions are defined:

Cavity No. 1: displacement of the tuning stub to increase the frequency of the cavity will cause the output response of the klystron to tilt to the high end of the band; conversely, a decrease in frequency for the cavity will tilt the response of the klystron towards the lower end of the band;

Cavity No. 2: this cavity is initially tuned to broaden the response when going from high efficiency tuning to broad-band tuning. Once broad-band tuning is obtained, this cavity is employed to both broaden the response (primarily at the lower frequency end of the band) and to make adjustments for power output and gain;

Cavity No. 3: this cavity is initially used to broaden the response when going from the high efficiency tuning to broad-band tuning. When broad-banded, this cavity will affect the high end of the band. When tuned higher in frequency, the bandwidth at the high frequency end will increase with a slight reduction in power level at the high end of the band. This cavity is normally adjusted in conjunction with cavity No. 4. To compensate for the reduction in power output slightly when cavity No. 3 is increased in frequency, cavity No. 4 should be moved slightly lower in frequency;

Cavity No. 4: cavity No. 4 is initially used to obtain power when going from a synchronous tuning condition to a high frequency tuning condition. Once the tube has been broad-banded, the cavity will affect primarily the power level at the high frequency end of the response with a lesser effect on the bandwidth at the high end of the band;

Cavity No. 5: cavity No. 5 has effectively the same impact on the response output as cavity No. 1, except that it has a greater effect on the high frequency end of the response.

Given such a description of the functional effect of each cavity tuner for the particular klystron of interest, a control program is prepared to map its amplitude response into a sequence of control operations for each of the cavity tuners. In so doing, the control program stored in processor 21 continuously compares the output response of the klystron 11 as monitored by spectrum analyzer 15 with the intended characteristic contained in the program and uses differences between the two, namely the difference between sought-after and actual amplitude response, to drive the stepping motors for the respective cavity tuners.

As an illustration, consider the set of response curves shown in FIGS. 2–5 for the above-mentioned VKX-7780F-1 type klystron, which differ from a sought-after flat response symmetrically centered about a center frequency e.g. Fc=8.0 GHz.

Tuning of the klystron is initiated by a coarse tuning procedure wherein each of the cavity tuning drive motors of assembly 26 is caused to be rotated to a predetermined position corresponding to a prescribed frequency. As noted above, "coarse-tune" information is supplied from the klystron manufacturer, indicating an initial displacement of the tuning stubs for the frequency of interest. Using that information, the settings of the stepping motor encoders 25 are calibrated to provide the processor 21 with a reference position from which to start. As an example, considering the above-referenced center frequency of 8.0 GHz, the tuning shaft encoders for each of the five cavities of the klystron may correspond to the values: Cavity No. 1=30; Cavity No. 2=26; Cavity No. 3=31; Cavity No. 4=21; and Cavity No. 5=16.

The number of revolutions for each cavity tuner is determined by starting the count of the encoders 25 from a full counter-clockwise position (zero) or against the klystron mechanical stop for each tuning shaft 27. Whenever a klystron is inserted or replaced, the tuning shafts are tuned to zero to assure that each encoder's position correctly corresponds to that location. As a result, when the center frequency is to be changed, the tuners do not have to be returned to zero. Its associated encoder 25 indicates the relative position and starts, or remembers, the count from that point.

Having initially set the klystron tuner positions at the coarse locations provided by the manufacturer, klystron 11 is turned on to provide an initial or coarse output characteristic over line 14 to spectrum analyzer 15. In accordance with the program stored in processor 21, with the klystron now being coarse-tuned, the next step is to obtain the maximum output power from the klystron 11. This is achieved by step tuning each cavity. The tuning procedure stored in the memory of processor 21 begins with cavity No. 1, coupling a signal over link 24 to its associated drive motor 26 causing the motor to step in a prescribed direction. If the RF output power over link 12 increases from the klystron, processor 21 causes the drive motor to be stepped further in the same direction. On the other hand, if the output power had decreased, the motor is driven two steps in the opposite direction to cause a power increase. Once the output power of the klystron has increased 1 dB for the cavity of interest, processor 21 proceeds to the stepping motor for the next cavity, namely cavity No. 2 and carries out the same prodedure that it carried out for cavity No. 1. This process is repeated for all five cavities and then begins again at cavity No. 1, repeating the above procedure to increase the output power by an additional increment of 1 dB for each cavity. This iterative advance of the stepping motors 26 is carried out until maximum power, as monitored by spectrum analyzer 15 and processor 21, is achieved. Maximum power is recognized when the last step for the stepping motor for each cavity of interest causes a decrease in the output power. At this point, processor 21 steps the motor back to its previous position prior to the detected decrease in klystron output power.

Once maximum RF output power from klystron 11 has been established using the above sequence, spectrum analyzer 15 would detect an amplitude response curve on either side of the center frequency Fc=8.0 GHz. That characteristic is digitized and supplied to processor 21 over bus 17. The resultant pattern is compared in processor 21 with a desired characteristic, as stored in memory, and processor 21 next proceeds to adjust the cavity tuners (via stepping motor assembly 26) until the output characteristic), as monitored by spectrum analyzer 15 falls within a prescribed tolerance or threshold of the characteristic stored in memory of processor 21.

Figure 2:
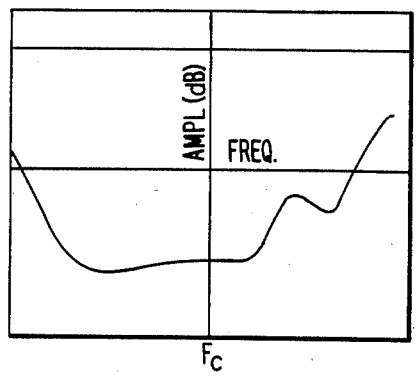
FIGS. 2-5 depict exemplary klystron amplitude response characteristics for illustrating the operation of the tuning system of FIG. 1.

As examples of this operation, let it be assumed that the desired output amplitude response of klystron 11 is a flat response substantially equally distributed about some center frequency (e.g. Fc=8.0 GHz). FIG. 2 illustrates the condition in which there is a "glich" or "wrinkle" at the high end of the amplitude response. In this circumstance, the program stored in processor 21 causes the stepping motor for cavity No. 4 to be rotated in a direction which would slightly increase the frequency to flatten out the upper portion of the curve.

Figure 3:
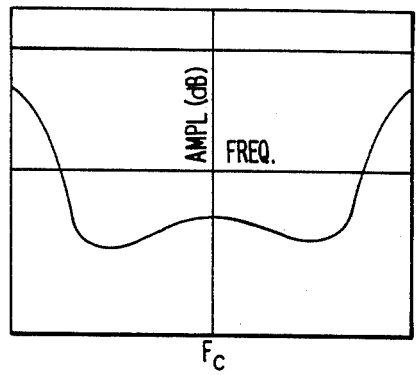

FIG. 3 shows an exemplary klystron response in which there is a hole or depression in the central part of the response at a small signal level. In this circumstance, the processor causes the stepping motor for cavity No. 1 to be rotated in a direction to increase the frequency, while that for cavity No. 2 is displaced to lower the frequency for that cavity.

Figure 4:
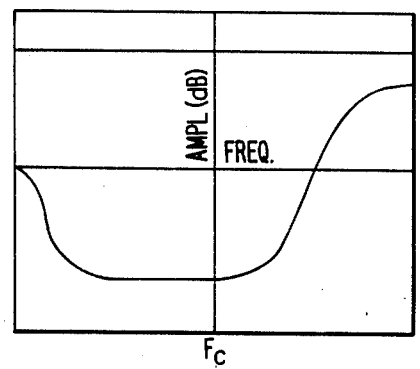

The response in FIG. 4 illustrates an acceptable and flat response at the lower end of the bandwidth but an insufficiently large response at the high end of the bandwidth. In this circumstance, processor 21 drives the motor to displace the tuning rod for cavity No. 3 to a position causing a higher frequency for cavity No. 3 and a lower frequency for cavity No. 4.

Figure 5:
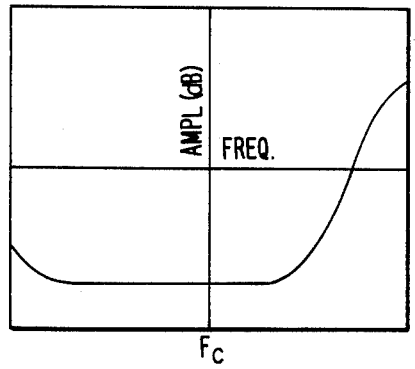

FIG. 5 illustrates a response curve having a 40 MHz bandwidth but not equally centered on each side of the center frequency. In this case, processor 21 drives the stepping motors for all of the cavities to slightly increase the frequency until the curve shifts. Depending upon the resultant characteristic monitored by spectrum analyzer 15, further displacement of the drive shafts of the output of the stepping motors is conducted until the response curve is flattened and centered about the center frequency.

As will be appreciated from the foregoing description, the processor-controlled drive motor system of the present invention provides a mechanism for automatically and precisely tuning a cavity klystron that does not suffer from the cumbersome and inexact procedure conventionally employed by a terminal operator. By monitoring the amplitude vs frequency of the klystron as it is being tuned, the system of the present invention is able to adapt its iterative control procedure to rapidly bring the output characteristic to within a prescribed tolerance.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. For use with a microwave power source containing a plurality of tuning elements through which the operation of the microwave power source is controlled, a method of adjusting the tuning elements and thereby causing the output of the microwave power source to effectively conform with an amplitude versus frequency response that has a prescribed shape over a prescribed bandwidth comprising the steps of:
   (a) monitoring the output of said microwave power source and generating an electrical signal representative of the monitored output; and
   (b) automatically adjusting at least one of said tuning elements until the electrical signal generated in step (a) indicates that the output of said microwave power source has an amplitude versus frequency response having said prescribed shape over said prescribed bandwidth.

2. A method according to claim 1, wherein step (a) comprises monitoring the amplitude versus frequency of said microwave power source, and wherein said prescribed shape of said amplitude versus frequency response is substantially flat over said prescribed bandwidth.

3. A method according to claim 1, wherein said microwave power source corresponds to a cavity klystron, tuning elements for which corresponding to respective cavity tuning elements of the cavities of said klystron.

4. A method according to claim 3, wherein step (a) comprises monitoring the amplitude versus frequency of said microwave power source, and wherein said prescribed shape of said amplitude versus frequency response is substantially flat over said prescribed bandwidth.

5. A method according to claim 4, wherein step (b) comprises automatically incrementally adjusting the tuning elements of the cavities of said klystron until the difference between the amplitude versus frequency response of the output of said klystron and said substantially flat amplitude versus frequency response is reduced to a preselected value.

6. For use with a microwave power source containing a plurality of tuning elements through which the operation of the microwave power source is controlled, an arrangement for automatically adjusting the tuning elements and thereby causing the output of the microwave power source to effectively conform with an amplitude versus frequency response that has a prescribed shape over a prescribed bandwidth:

first means, coupled to the output of said microwave power source, for monitoring the output of said microwave power source and generating a first output signal representative of the amplitude versus frequency response of said power source of over said prescribed bandwidth; and second means, coupled to receive the first output signal generated by said first means and to said tuning elements, for adjusting at least one of said tuning elements until said amplitude versus frequency response monitored by said first means has said prescribed shape over said prescribed bandwidth.

7. An arrangement according to claim 6, wherein said prescribed shape of said amplitude versus frequency response is substantially flat over said prescribed bandwidth.

8. An arrangement according to claim 6, wherein said microwave power source corresponds to a cavity klystron, tuning elements therefor corresponding to respective cavity tuning elements of the cavities of said klystron.

9. An arrangement according to claim 8, wherein said prescribed shape of said amplitude versus frequency response is substantially flat over said prescribed bandwidth.

10. An arrangement according to claim 9, wherein said second means comprises means for incrementally adjusting the tuning elements of the cavities of said klystron until the difference between the amplitude versus frequency response of the output of said klystron and said substantially flat amplitude versus frequency response is reduced to a preselected value.

11. An arrangement according to claim 10, wherein said incrementally adjusting means comprises a plurality of digitally controlled stepping motors each of which is coupled to a respective one of said tuning elements for incrementally controlling the displacement of said tuning elements relative to a reference position therefor in response to a digital control signal generated in response to said difference.

12. An arrangement according to claim 11, wherein said first means comprises a spectrum analyzer producing a digital output signal representative of the amplitude versus frequency response of the output of said klystron, wherein said second means comprises means for storing information representative of said shape of the amplitude versus frequency and for generating digital control signals for operating said digitally controlled stepping motors in response to differences in said stored information and the digital output signal produced by said spectrum analyzer.

* * * * *